(12) United States Patent
Hu

(10) Patent No.: US 12,284,867 B2
(45) Date of Patent: Apr. 22, 2025

(54) DISPLAY PANEL, PREPARATION METHOD OF DISPLAY PANEL, AND DISPLAY DEVICE

(71) Applicant: Wuhan Tianma Microelectronics Co., Ltd., Wuhan (CN)

(72) Inventor: Liang Hu, Wuhan (CN)

(73) Assignee: Wuhan Tianma Microelectronics Co., Ltd., Wuhan (CN)

(*) Notice: Subject to any disclaimer, the term of this patent is extended or adjusted under 35 U.S.C. 154(b) by 377 days.

(21) Appl. No.: 17/723,577

(22) Filed: Apr. 19, 2022

(65) Prior Publication Data

US 2022/0238846 A1    Jul. 28, 2022

(30) Foreign Application Priority Data

Jun. 30, 2021 (CN) .......................... 202110739070.9

(51) Int. Cl.
| | | |
|---|---|---|
| H10K 50/80 | (2023.01) | |
| H10K 50/858 | (2023.01) | |
| H10K 50/86 | (2023.01) | |
| H10K 59/40 | (2023.01) | |
| H10K 59/35 | (2023.01) | |

(52) U.S. Cl.
CPC .......... H10K 50/858 (2023.02); H10K 50/86 (2023.02); H10K 59/40 (2023.02); *H10K 59/35* (2023.02)

(58) Field of Classification Search
CPC ........ H10K 59/35; H10K 59/40; H10K 59/80; H10K 59/86; H10K 59/122; H10K 59/858; H10K 59/879; H10K 59/8791; H10K 71/00; H01L 27/15; H01L 27/32; H01L 27/156; H01L 27/323; H01L 27/3211

USPC .......................................................... 259/89
See application file for complete search history.

(56) References Cited

U.S. PATENT DOCUMENTS

| | | | | |
|---|---|---|---|---|
| 2014/0353626 | A1* | 12/2014 | Shim | ................... G02B 1/11 |
| | | | | 359/601 |
| 2022/0005874 | A1* | 1/2022 | Oh | ................... H10K 59/873 |
| 2022/0140283 | A1* | 5/2022 | Kim | ................... H10K 59/873 |
| | | | | 257/40 |

FOREIGN PATENT DOCUMENTS

| | | |
|---|---|---|
| CN | 103576469 A | 2/2014 |
| CN | 110429029 A | 11/2019 |
| CN | 112289958 A | 1/2021 |

\* cited by examiner

*Primary Examiner* — Chuong A Luu
(74) *Attorney, Agent, or Firm* — KDW Firm PLLC

(57) ABSTRACT

Provided are a display panel, a preparation method of a display panel, and a display device. The display panel includes a display function layer, an anti-reflective function layer and a base material layer therebetween. The display function layer includes multiple light-emitting elements and a pixel definition structure surrounding the light-emitting elements. The anti-reflective function layer is disposed on a light emitting side of the display function layer and includes a first refractive index pattern, and the first refractive index pattern overlaps the pixel definition structure. The base material layer includes a light uniformizing structure, the light uniformizing structure includes a first inclined sidewall, and in a light emitting direction of the light-emitting elements, the first inclined sidewall is inclined towards a direction away from a light-emitting element adjacent to the first inclined sidewall, and the first refractive index pattern covers the first inclined sidewall.

18 Claims, 10 Drawing Sheets

DISPLAY PANEL, PREPARATION METHOD OF DISPLAY PANEL, AND DISPLAY DEVICE

CROSS-REFERENCE TO RELATED APPLICATIONS

This application claims priority to Chinese patent application No. 202110739070.9 filed with the China National Intellectual Property Administration (CNIPA) on Jun. 30, 2021, the disclosure of which is incorporated herein by reference in its entirety.

TECHNICAL FIELD

Embodiments of the present disclosure relate to the technical field of display, and in particular, a display panel, a preparation method of a display panel, and a display device.

BACKGROUND

The lithographic technology forms an exposed region and an unexposed region by exposing a surface coated with a photosensitive material in a certain pattern, and an exposed region pattern or an unexposed region pattern is retained. The lithographic technology is mainly used for manufacturing semiconductor elements, printed circuit boards, display panels, and the like.

An existing film layer of a display panel generally includes a display function layer and an anti-reflective function layer, the anti-reflective function layer is manufactured by adopting the lithographic technology, and the anti-reflective effect of the display panel is affected, since phenomena of holes, undercuts and the like are easily generated at the bottom of the anti-reflective function layer during exposure and development of the lithographic process.

SUMMARY

The present disclosure provides a display panel, a preparation method of a display panel, and a display device, so as to avoid the phenomena of undercuts and the like generated at the bottom of a low refractive layer after lithographic exposure and development and further improve the anti-reflective effect of the display panel.

The present disclosure provides a display panel. The display panel includes a display function layer, an anti-reflective function layer and a base material layer. The display function layer includes multiple light-emitting elements and a pixel definition structure surrounding the multiple light-emitting elements. The anti-reflective function layer is disposed on the light emitting side of the display function layer and includes a first refractive index pattern, and the first refractive index pattern overlaps with the pixel definition structure. The base material layer is disposed between the anti-reflective function layer and the display function layer and includes a light uniformizing structure, the light uniformizing structure includes a first inclined sidewall, and in a light emitting direction of the multiple light-emitting elements, the first inclined sidewall is inclined towards a direction away from a light-emitting element adjacent to the first inclined sidewall, and the first refractive index pattern covers the first inclined sidewall.

The present disclosure further provides a display device. The display device includes the display panel described above.

The present disclosure further provides a preparation method of a display panel. The preparation method includes the steps described below. A display function layer is formed, the display function layer includes multiple light-emitting elements and a pixel definition structure surrounding the multiple light-emitting elements; a base material layer is formed on a light emitting side of the display function layer, the base material layer includes a light uniformizing structure, the light uniformizing structure includes a first inclined sidewall, and in a light emitting direction of the multiple light-emitting elements, the first inclined sidewall is inclined towards a direction away from a light-emitting element adjacent to the first inclined sidewall; and an anti-reflective function layer is formed on a light emitting side of the base material layer, the anti-reflective function layer includes a first refractive index pattern, the first refractive index pattern overlaps with the pixel definition structure, and the first refractive index pattern covers the first inclined sidewall.

DETAILED DESCRIPTION

Figure 1:
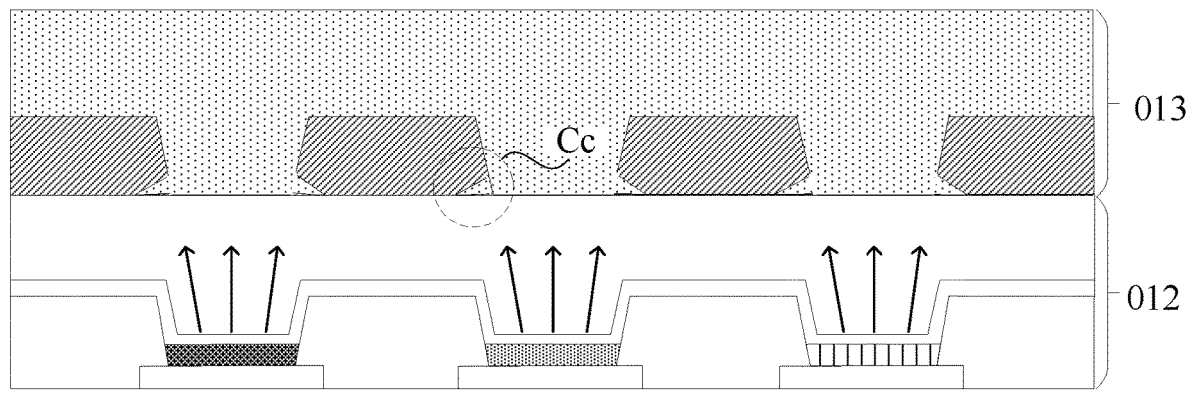
FIG. 1 is a structural schematic view of a display panel in the related art.

The present disclosure will be further described in detail in conjunction with the drawings and embodiments below. It should be understood that the specific embodiments described herein are merely used for explaining the present disclosure and are not intended to limit the present disclosure. It should also be noted that, for ease of description, only some, but not all, of the structures related to the present disclosure are shown in the drawings.

Embodiments of the present disclosure provide a display panel, a preparation method of a display panel, and a display device. The display panel includes a display function layer, an anti-reflective function layer and a base material layer. The display function layer includes multiple light-emitting elements and a pixel definition structure surrounding the multiple light-emitting elements. The anti-reflective function layer is disposed on a light emitting side of the display function layer and includes a first refractive index pattern, and the first refractive index pattern overlaps with the pixel definition structure. The base material layer is disposed between the anti-reflective function layer and the display function layer and includes a light uniformizing structure, the light uniformizing structure includes a first inclined sidewall, and in a light emitting direction of the multiple light-emitting elements, the first inclined sidewall is inclined towards a direction away from a light-emitting element adjacent to the first inclined sidewall, and the first refractive index pattern covers the light uniformizing structure.

According to the display panel provided in the embodiments of the present disclosure, the base material layer including the light uniformizing structure is arranged between the display function layer and the anti-reflective function layer, so that the first refractive index pattern in the anti-reflective function layer coats the light uniformizing structure, and the light uniformizing structure forms the first inclined sidewall with a light emitting surface of the multiple light-emitting elements. Then, exposure light incident on the first inclined sidewall is scattered, sensitivity of light incident by the photoresist on the bottom layer of the first refractive index pattern is enhanced, and the degree of curing the bottom layer of the first refractive index pattern in the anti-reflective function layer is improved. When the sensitivity of the bottom layer of the first refractive index pattern is enhanced, the phenomena of holes, undercuts and the like caused by relatively weak light sensitivity at the bottom of the first refractive index pattern can be effectively avoided.

The above is the core idea of the present disclosure, and the technical schemes of the embodiments of the present disclosure will be described clearly and completely in connection with the accompanying drawings in the embodiments of the present disclosure below. All other embodiments obtained by those skilled in the art based on the embodiments of the present disclosure without requiring creative efforts shall all fall in the scope of protection of the present disclosure.

FIG. 1 is a structural schematic view of a display panel in the related art. As shown in FIG. 1, an existing display panel film layer includes a display function layer 012 and an anti-reflective function layer 013, and the anti-reflective function layer 013 is manufactured by adopting the lithographic technology. When the lithographic process is used for exposure and development, an exposure light source is vertically incident on the anti-reflective function layer 013 from top to bottom, so that light incident on the bottom of the anti-reflective function layer 013 has relatively weak light sensitivity. In a preparation process of the display panel, the anti-reflective function layer 013 is usually made of a negative tone photoresist material, and this kind of negative tone photoresist material is poor in the curing effect, so that the bottom with a poor curing effect of a non-exposure region is easy to be washed off when the lithographic technology is adopted for exposure and development, thereby an undercut phenomenon as shown in FIG. 1 occurs at the bottom of the anti-reflective function layer 013 (as shown by the dashed box Cc in FIG. 1).

Based on the above problems existing in the related art, an embodiment of the present disclosure provides a display panel, which can effectively solve the phenomena of undercuts, holes, pattern edge warpings and the like caused by the relatively low photosensitivity of the bottom of the anti-reflective function layer, and further improve the anti-reflective effect of the display panel.

Figure 2:
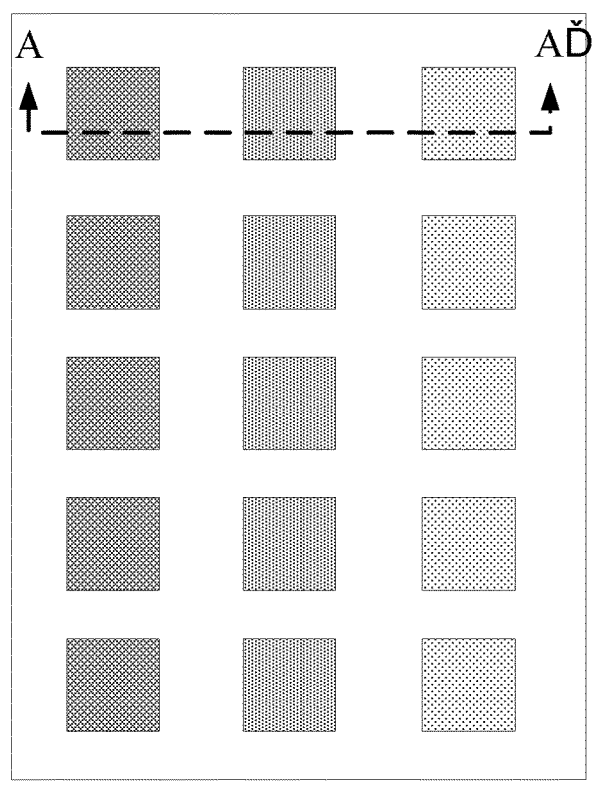
FIG. 2 is a schematic top view of a structure of a display panel provided in an embodiment of the present disclosure.
Figure 3:
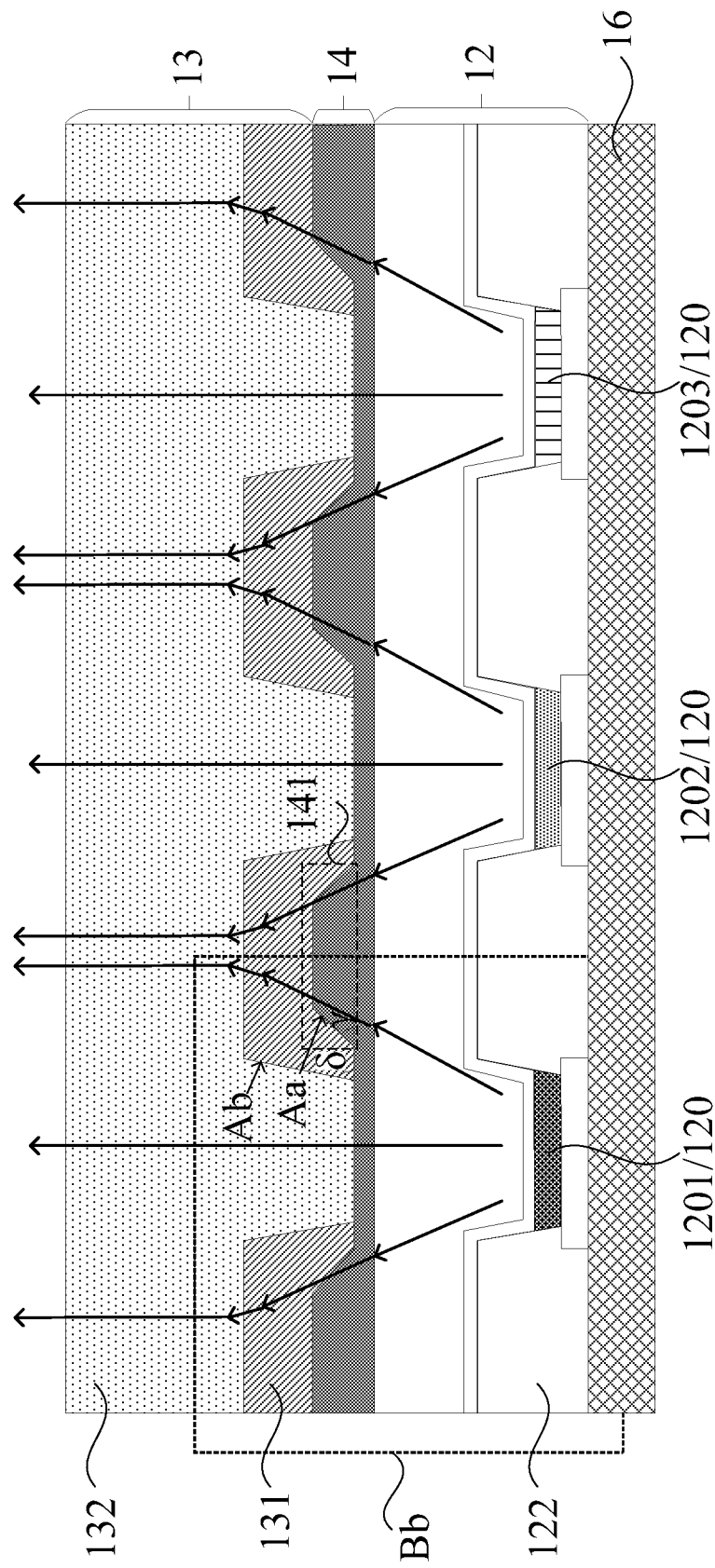
FIG. 3 is a schematic cross-sectional view of FIG. 1 taken along a dashed line AA'.

FIG. 2 is a schematic top view of a structure of a display panel provided in an embodiment of the present disclosure. FIG. 3 is a schematic cross-sectional view of FIG. 1 taken along a dashed line AA'. Referring to FIG. 2 and FIG. 3, the display panel 10 includes a display function layer 12, an anti-reflective function layer 13 and a base material layer 14. The display function layer 12 includes multiple light-emitting elements 120 and a pixel definition structure 122 surrounding the light-emitting elements 120. The anti-reflective function layer 13 is disposed on a light emitting side of the display function layer 12 and includes a first refractive index pattern 131, and the first refractive index pattern 131 overlaps with the pixel definition structure 122. The base material layer 14 is disposed between the anti-reflective function layer 13 and the display function layer 12 and includes a light uniformizing structure 141, and the light uniformizing structure 141 includes a first inclined sidewall Aa. In a light emitting direction of the multiple light-emitting elements 120, the first inclined sidewall Aa is inclined towards a direction away from a light-emitting element 120 adjacent to the first inclined sidewall Aa, and the first refractive index pattern 131 covers the light uniformizing structure 141.

The pixel definition structure 122 is used for defining a light emitting region, being conducive to improving the color mixing problem. In this embodiment, the anti-reflective function layer 13 is used for improving the light transmittance and display efficiency. The first refractive index pattern 131 in the anti-reflective function layer 13 is manufactured by exposure and development through the lithographic process. Because an exposure light source is incident on the display panel from top to bottom, light on the surface of the first refractive index pattern 131 in the anti-reflective function layer has relatively strong light sensitivity while light on the bottom of the first refractive index pattern 131 has relatively weak light sensitivity, therefore, the degree of curing of the bottom of the first refractive index pattern 131 obtained after lithographic is relatively low, and a relatively low degree of curing may further cause the phenomena of undercuts, holes or the like at the bottom of the first refractive index pattern 131 which is in the anti-reflective function layer 13 and close to the base material layer 14. In order to avoid such situations, in the embodiments of the present disclosure, multiple light uniformizing structures 141 are designed on the base material layer 14 between the anti-reflective function layer 13 and the display function layer 12, each light uniformizing structure 141 is arranged at the bottom of each first refractive index pattern 131 close to the display function layer 12, and each light uniformizing structure 141 is covered by each first refractive index pattern 131. The principle that the light uniformizing structure 141 improves the degree of curing of the bottom of the first refractive index pattern 131 is explained in detail below.

Firstly, the first refractive index pattern 131 is manufactured after exposure and development through the lithographic technology, the first refractive index pattern 131 is a convex structure in the anti-reflective function layer 13, and when each first refractive index pattern 131 covers each light uniformizing structure 141, this kind of light uniformizing structure 141 is also a convex structure on the base material layer. In this embodiment, as shown in the cross-sectional view in FIG. 3, the first refractive index pattern 131 formed after the exposure and development by using the lithographic technology is a regular-trapezoid structure with a narrower upper surface and a wider lower surface, and each light uniformizing structure 141 is coated inside the corresponding first refractive index pattern 131 and is also a regular-trapezoid structure with a narrower upper surface and a wider lower surface. In some other embodiments, the shape of the first refractive index pattern 131 may also be other shapes and may be determined by the patterning design before lithographic by those skilled in the art, which is not limited herein.

Referring to the cross-sectional view shown in FIG. 3, each light uniformizing structure 141 has an upwardly protruding regular-trapezoid structure on the base material layer 14, therefore, an angle less than 90° is formed between the first inclined sidewall Aa and the surface of a side of the base material layer 14 away from the display function layer 12. In this embodiment, when the lithographic technology is used for the exposure and development, each light uniformizing structure 141 in the base material layer 14 is located in an exposure region, therefore, when the exposure light irradiates the first inclined sidewall Aa of the light uniformizing structure 141, a lot of exposure light on the first inclined sidewall Aa is scattered, so that the sensitivity of light incident by the photoresist on the bottom layer of the first refractive index pattern 131 is enhanced, the degree of curing of the bottom layer of the first refractive index pattern 131 in the anti-reflective function layer 13 is improved. When the sensitivity of the bottom layer of the first refractive index pattern 131 close to the base material layer 14 is enhanced, the phenomena of holes, undercuts and the like caused by the relatively weak light sensitivity at the bottom of the first refractive index pattern 131 can be effectively avoided.

After the structure of the display panel provided in this embodiment is described, a flow of a process preparation of the display panel in this embodiment is set forth immediately.

Figure 4:
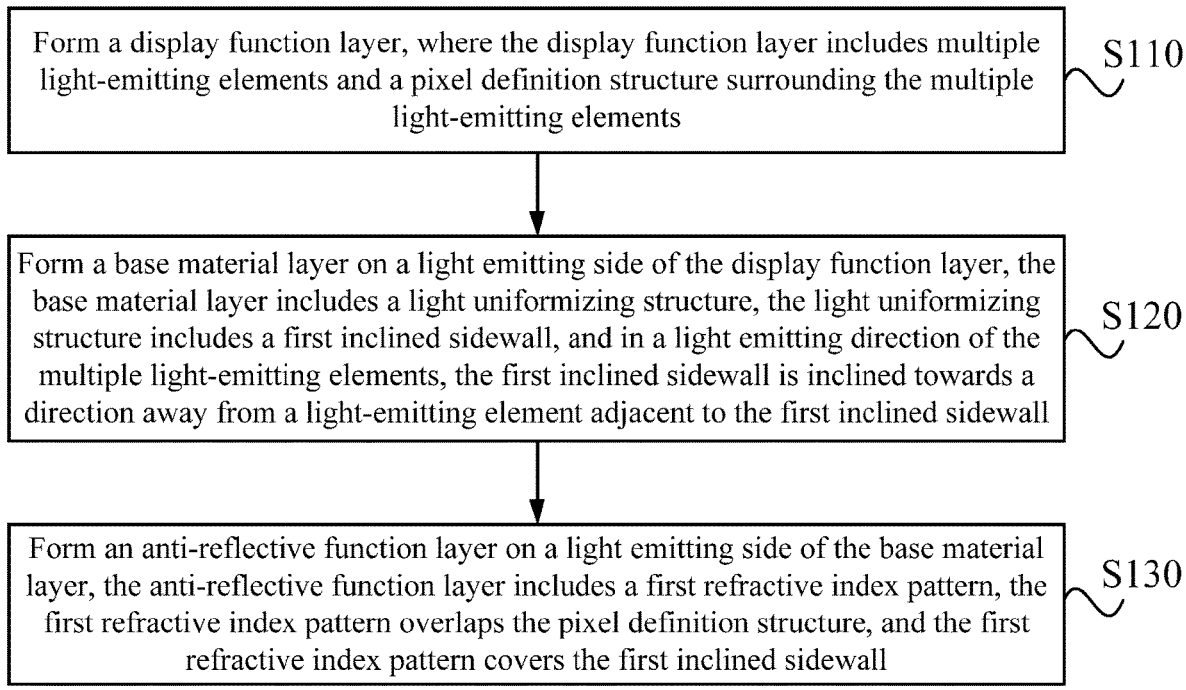
FIG. 4 is a flowchart of a preparation method of a display panel provided in an embodiment of the present disclosure.

FIG. 4 is a flowchart of a preparation method of a display panel provided in an embodiment of the present disclosure. As shown in FIG. 4, the method includes the following steps.

In S110, a display function layer is formed, and the display function layer includes multiple light-emitting elements and a pixel definition structure surrounding the multiple light-emitting elements.

In S120, a base material layer is formed on a light emitting side of the display function layer, the base material layer includes a light uniformizing structure, the light uniformizing structure includes a first inclined sidewall, and in a light emitting direction of the multiple light-emitting elements, the first inclined sidewall is inclined towards a direction away from a light-emitting element adjacent to the first inclined sidewall.

In S130, an anti-reflective function layer is formed on a light emitting side of the base material layer, the anti-reflective function layer includes a first refractive index pattern, the first refractive index pattern overlaps with the pixel definition structure, and the first refractive index pattern covers the light uniformizing structure.

The preparation method of the display panel provided in this embodiment is described in detail below from the perspective of process preparation.

FIGS. 5A to 5F show a flowchart of a process preparation of a display panel provided in an embodiment of the present disclosure. Referring to FIG. 4, the process preparation method includes the following steps.

Figure 5A:
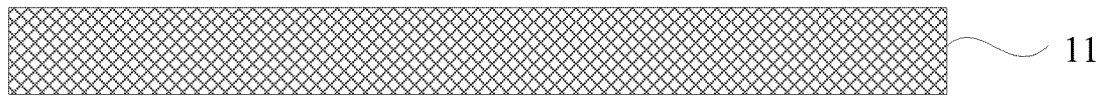
FIGS. 5A to 5F are diagrams illustrating a flow of a process preparation of a display panel provided in an embodiment of the present disclosure.

Referring to FIG. 5A, an array substrate 11 is provided.

Figure 5B:
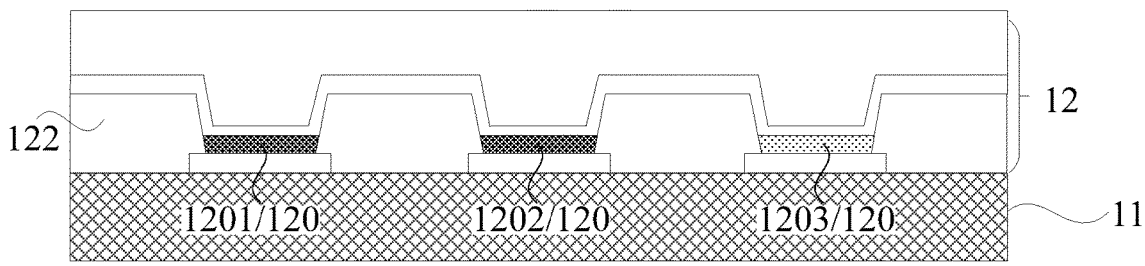

Referring to FIG. 5B, a display function layer 12 is formed on the array substrate 11, and the display function layer 12 includes multiple light-emitting elements 120 and a pixel definition structure 122 surrounding the light-emitting elements 120.

The preparation method for forming the display function layer 12 on the array substrate 11 may adopt technical means commonly used by those skilled in the art, which is not limited here.

Figure 5C:
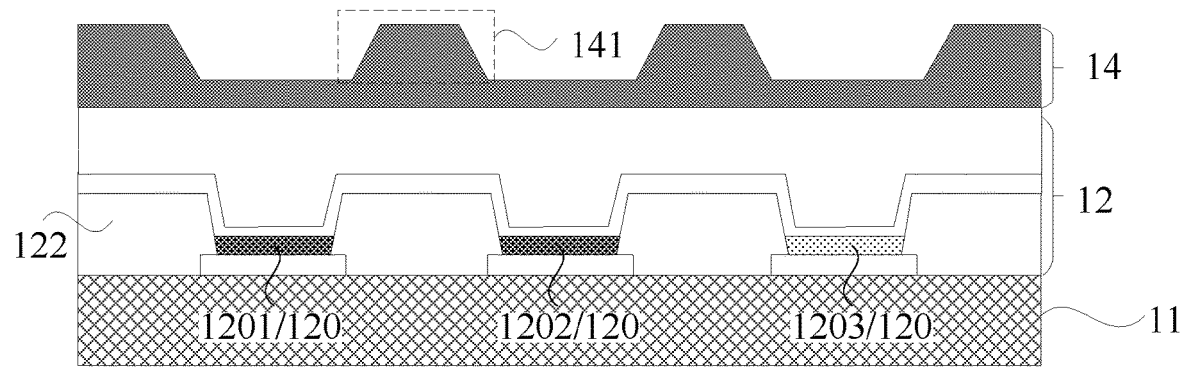

Referring to FIG. 5C, a base material layer 14 is formed on a light emitting side of the display function layer 12, the base material layer 14 includes a light uniformizing structure 141, the light uniformizing structure 141 includes a first inclined sidewall, and in a light emitting direction of the multiple light-emitting elements 120, the first inclined sidewall is inclined towards a direction away from a light-emitting element 120 adjacent to the first inclined sidewall.

Exemplarily, in this embodiment, the base material layer may be formed by depositing a layer of material on a light emitting layer of the display function layer through a deposition method. The light uniformizing structure on the base material layer may be integrally designed, or after the base material layer is deposited, the light uniformizing structure is formed on the base material layer by designing a structure made of the same material as the base material layer in a patterning manner through the lithographic technology.

It should be noted that the photoresist may also be patterned by those skilled in the art using other patterning processes, such as nanoimprinting, which is not limited in this embodiment.

In addition, it should be noted that if a second insulating layer and a second electrode layer in a touch function layer provided in the above embodiments are directly also used as the base material layer, the process of independently preparing the base material layer may be omitted.

Figure 5D:
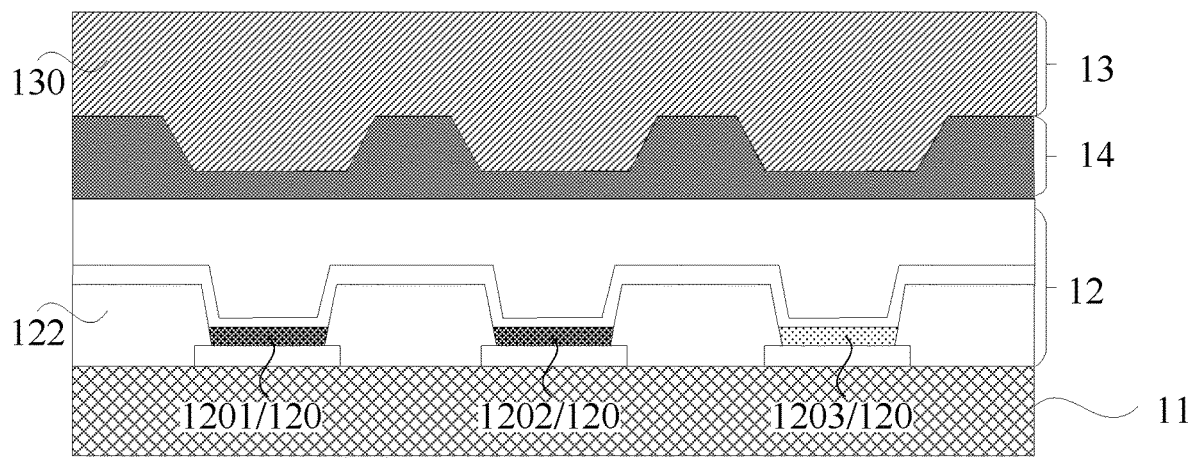

Referring to FIG. 5D, an anti-reflective function layer 13 is formed on the light emitting side of the base material layer 14, and the anti-reflective function layer 13 includes a low-refractive layer 130 close to the base material layer.

Similarly, with reference to the process steps in forming the base material layer described above, the low-refractive layer 130 is formed on the base material layer 12 to improve the light transmittance.

Figure 5E:
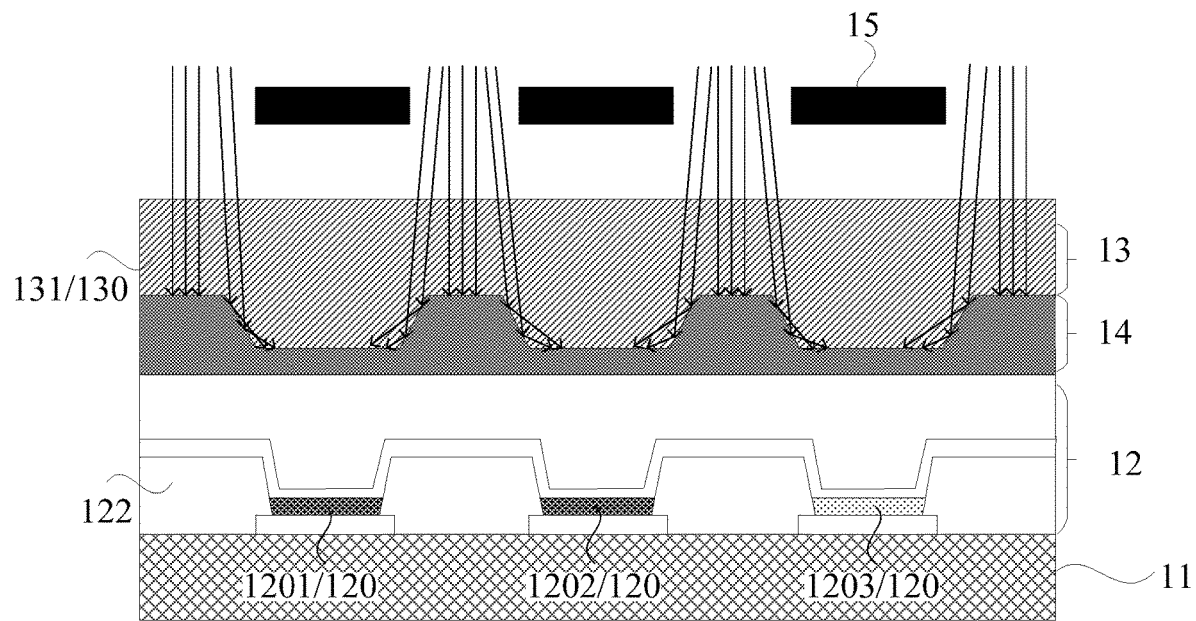

Next, referring to FIG. 5E, exposure is performed by using the lithographic process.

In this embodiment, a film layer where the low-refractive layer 130 is located is also used as negative tone photoresist, and the thickness of the photoresist may be adjusted through a spin coating process or a spray coating process. Next, the low-refractive layer 130 is exposed using the lithographic technology, where the exposure light source is incident at an open region of a photomask 15.

Figure 5F:
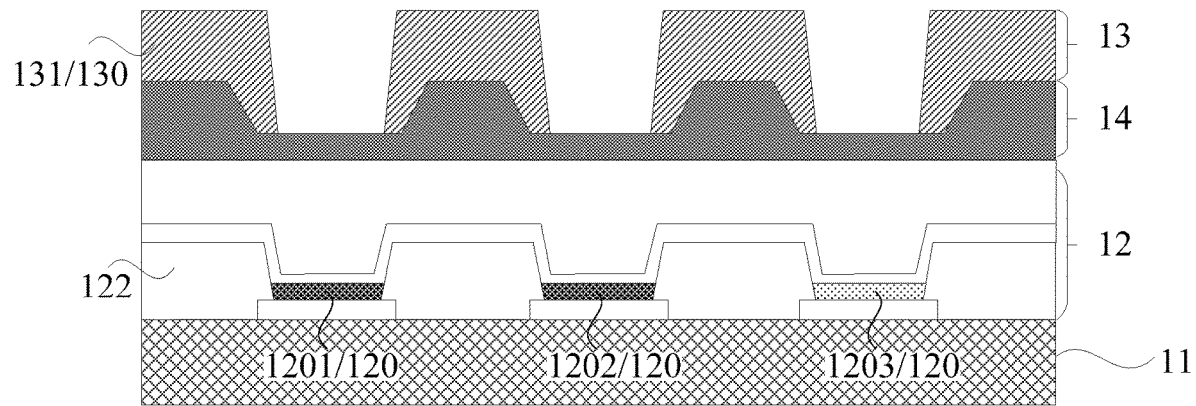

Referring to FIG. 5F, a wet etching process may be adopted for pattern transfer, and the low-refractive layer 130 with a photoresist mask body is cleaned to obtain first refractive index patterns 131 periodically arranged in the low-refractive layer 1311.

It should be noted that the photoresist in this embodiment is the negative tone photoresist, and the negative tone photoresist is a mixed liquid which is generally composed of three main components of a photosensitive resin, a sensitizer and a solvent and has the light sensitization. After the photosensitive resin is illuminated, a photocuring reaction quickly occurs in the exposure region, so that the physical property of the photoresist is obviously changed, and then the soluble part is dissolved away through a proper solvent treatment to obtain the required pattern, namely the first refractive index pattern finally obtained in the embodiment. The negative tone photoresist material has a poor curing effect, and when the lithographic technology is adopted for the exposure and development, the negative tone photoresist material in a development and non-exposure region of the bottom with the poor curing effect is easy to be washed away.

With continued reference to FIG. 3, an included angle $\gamma$ between the first inclined sidewall Aa and the light emitting surface may be greater than or equal to 45°.

Figure 6:
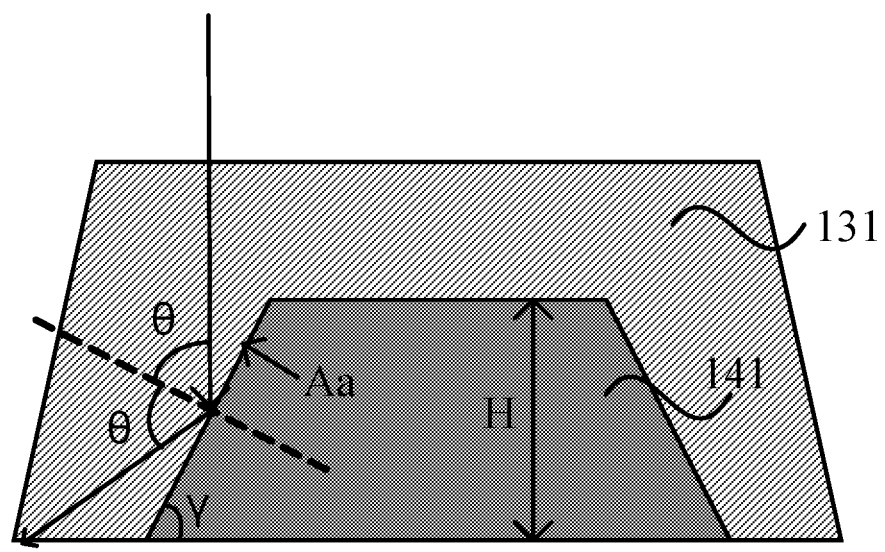
FIG. 6 is a partial schematic view of exposure light incident on a light uniformizing structure in a display panel provided in an embodiment of the present disclosure.

As described above, the first inclined sidewall Aa may be understood to form an included angle less than 90° with the surface of a side of the base material layer 14 away from the display function layer 12, and this included angle, i.e., the included angle between the first inclined sidewall Aa and the light emitting surface, is denoted by $\gamma$. In order to cure the bottom layer of the first refractive index pattern 131, incident light is reflected after hitting the first inclined sidewall Aa, and a direction of the reflected light needs to be kept in a direction of irradiating the bottom of the first refractive index pattern 131 as much as possible. FIG. 6 is a partial schematic view of exposure light incident on a light uniformizing structure in a display panel provided in an embodiment of the present disclosure. Referring to FIG. 6, after light is incident on the first inclined sidewall Aa, a light path diagram of the reflected light to the bottom of the first refractive index pattern 131 is shown by the arrow, and $2\theta \geq 90°$, i.e., $\theta \geq 45°$. On the basis of the above, when the included angle $\gamma$ between the first inclined sidewall Aa and the light emitting surface is set to be greater than or equal to 45°, it can effectively guarantee that the bottom of the first refractive index pattern is prevented from being undercut in a controllable range.

With continued reference to FIG. 6, a height H of the light uniformizing structure 141 in the light emitting direction may be greater than or equal to 0.5 μm.

Referring to FIG. 3, since the light uniformizing structure 141 is coated inside the first refractive index pattern 131, the light uniformizing structure 141 is mainly configured to scatter exposure light when the exposure light is incident, so that the photosensitive effect irradiated on the bottom of the first refractive index pattern 131 is increased. When the height of the light uniformizing structure 141 is less than 0.5 μm, a light attachment area of the first inclined sidewall Aa of the light uniformizing structure 141 is reduced, when the light is incident on the first inclined sidewall Aa, the exposure light is less scattered, and the problem of relatively weak light sensitivity at the bottom of the first refractive index pattern 131 cannot be improved. On the basis that the included angle $\gamma$ between the first inclined sidewall Aa and the light emitting surface is greater than or equal to 45° in the above embodiments, when the height H of the light uniformizing structure 141 is determined to be greater than or equal to 0.5 μm, the light attachment area of the first inclined sidewall Aa of the light uniformizing structure 141 is increased, the number of exposure light scattered on the first inclined sidewall Aa is increased, thereby the photosensitive intensity reflected onto the bottom of the first refractive index pattern 131 is improved, thus increasing the degree of curing of the bottom of the first refractive index pattern 131.

The display panel provided in this embodiment includes the display function layer, the anti-reflective function layer and the base material layer. The display function layer includes the multiple light-emitting elements and the pixel definition structure surrounding the multiple light-emitting elements. The anti-reflective function layer is disposed on the light emitting side of the display function layer and includes the first refractive index pattern, and the first refractive index pattern overlaps with the pixel definition structure. The base material layer is disposed between the anti-reflective function layer and the display function layer and includes a light uniformizing structure, the light uniformizing structure includes the first inclined sidewall, and in the light emitting direction of the multiple light-emitting elements, the first inclined sidewall is inclined towards the direction away from the light-emitting element adjacent to the first inclined sidewall, and the first refractive index pattern covers the light uniformizing structure. According to the technical scheme of this embodiment, the base material layer including the light uniformizing structure is arranged between the display function layer and the anti-reflective function layer, so that the first refractive index pattern in the anti-reflective function layer coats the light uniformizing structure, and the light uniformizing structure forms the first inclined sidewall with the light emitting surface. Then, exposure light incident on the first inclined sidewall is scattered, the sensitivity of light incident by the photoresist on the bottom layer of the first refractive index pattern is enhanced, and the degree of curing of the first refractive index pattern in the anti-reflective function layer is improved. When the sensitivity of the bottom layer of the first refractive index pattern close to the base material layer is enhanced, the phenomena of holes, undercuts and the like caused by the relatively weak light sensitivity at the bottom of the first refractive index pattern can be effectively avoided.

In an embodiment, the light uniformizing structures may be arranged to surround the light-emitting elements or may be arranged to be discretely around the light-emitting elements.

In an embodiment, the first refractive index pattern may be made of a negative tone photoresist material.

The negative tone photoresist material is an organic solution containing a cyclized rubber-based resin and a compound having photosensitive properties, and the negative tone photoresist material generates a crosslinking reaction by light irradiation and has the insolubility through superposition and hardening by a developer, that is, since a difference in solubility exists between an exposed portion and a non-exposed portion formed after exposure, an image may be formed by using this characteristic. When the lithographic technology is adopted for the exposure and development, the negative tone photoresist material has the characteristics of high chemical stability, sensitivity and wet etching resistance.

In this embodiment, when the lithographic technology is used for exposure and development, an exposure region and a non-exposure region exist, the first refractive index pattern is easy to be prepared after patterning design and the exposure and development by utilizing the high-quality characteristic of the negative tone photoresist material described above, and the formation and size of the first refractive index pattern can be easily controlled.

With continued reference to FIG. 3, the first refractive index pattern 131 includes a second inclined sidewall Ab, and in the light emitting direction of the light-emitting elements 120, the second inclined sidewall Ab is inclined towards a direction away from a light-emitting element 120 adjacent to the second inclined sidewall.

As described above, the first refractive index pattern 131 has the convex regular-trapezoid structure and covers the light uniformizing structure 141, therefore, the second inclined sidewall Ab of the first refractive index pattern 131 and the first inclined sidewall Aa of the light uniformizing structure 141 face the same direction and are both inclined in the direction away from the light-emitting element 120 adjacent to the first inclined sidewall Aa and the second inclined sidewall Ab, thereby facilitating scattering of exposure light incident on the sidewall.

It should be noted that an included angle between the second inclined sidewall Ab and the light emitting surface in this embodiment is different from the included angle between the first inclined sidewall Aa and the light emitting surface in the above embodiments.

In this embodiment, referring to FIG. 3, the included angle between the light emitting surface and the second inclined sidewall Ab of the first refractive index pattern 131 is denoted by δ, and the larger the included angle γ between the light emitting surface and the first inclined sidewall Aa of the light uniformizing structure 141 is, the larger the included angle δ between the light emitting surface and the second inclined sidewall Ab of the first refractive index pattern 131 is. For example, during manufacture of the display panel in this embodiment, when the included angle γ between the first inclined sidewall Aa and the light emitting surface is set to be 45°, the included angle δ between the second inclined sidewall Ab and the light emitting surface is 70°; when the included angle gamma between the first inclined sidewall Aa and the light emitting surface is set to be 50°, the included angle δ between the second inclined sidewall Ab and the light emitting surface is 73°; when the included angle γ between the first inclined sidewall Aa and the light emitting surface is set to be 55°, the included angle δ between the second inclined sidewall Ab and the light emitting surface is 75°; and when the included angle γ between the first inclined sidewall Aa and the light emitting surface is set to be 60°, the included angle δ between the second inclined sidewall Ab and the light emitting surface is 78°. By setting different included angles, the length of a light scattering path exposure light after being incident on the inclined sidewall can be effectively controlled, and the photosensitive intensity of the light incident by the photoresist on the bottom layer of the first refractive index pattern 131 is enhanced, and the degree of curing between the bottom layer of the first refractive index pattern 131 in the anti-reflective function layer 13 and the surface of the side of the base material layer 14 away from the display function layer 12 is further improved.

Figure 7:
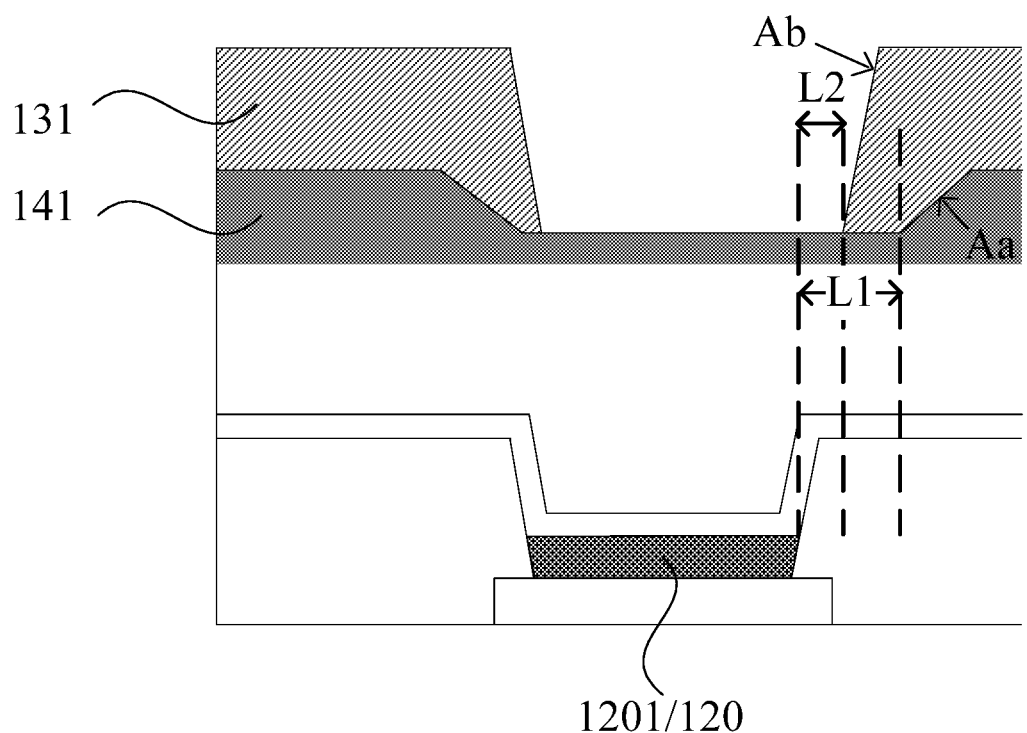
FIG. 7 is an enlarged schematic view of a dashed box Bb of FIG. 3.

FIG. 7 is an enlarged schematic view of a dashed box Bb of FIG. 3. As shown in FIG. 7, in a direction parallel to the light emitting surface, in the first inclined sidewall Aa and the second inclined sidewall Ab that are adjacent to the same light-emitting element 120, a distance between the first inclined sidewall Aa and the first light-emitting element 120 is a first distance L1, a distance between the second inclined sidewall Ab and the light-emitting element 120 is a second distance L2, and a difference between the first distance L1 and the second distance L2 is 2 μm to 3 μm.

The first refractive index pattern 131 overlaps with the pixel definition structure 122, and one light-emitting element 120 is disposed within an opening of the pixel definition structure 122, so that the color mixing phenomenon can be effectively avoided.

As shown in FIG. 7, an opening of the first refractive index pattern 131 is larger than the opening of the pixel definition structure 122. In other embodiments, it may be provided that the opening of the first refractive index pattern is smaller than the opening of the pixel definition structure, i.e., the first refractive index pattern has an overlapping portion with the light-emitting element.

Referring to FIG. 7, a distance from the first inclined sidewall Aa of the light uniformizing structure 141 to the elongated direction of the light-emitting element 120 in the figure is L1, and a distance from the second inclined sidewall Ab of the first refractive index pattern 131 to the elongated direction of the light-emitting element 120 in the figure is L2. In order to effectively control the exposure light to be scattered after being incident on the inclined sidewall, the light hitting the first refractive index pattern 131 may effectively reach the bottom of the first refractive index pattern 131, so that the bottom of the first refractive index pattern 131 also has relatively high photosensitivity, so as to increase the degree of curing of the anti-reflective function layer. When the difference between the first distance L1 and the second distance L2 is less than 2 μm, the light reflected after the exposure light is incident on the inclined sidewall reaches a side of the bottom of the to-be-formed first refractive index pattern 131 away from the inclined sidewall; and when the difference between the first distance L1 and the second distance L2 is larger than 3 μm, the light reflected after the exposure light is incident on the inclined sidewall cannot reach the bottom of the to-be-formed first refractive index pattern 131, such that it may easily cause holes on the bottom layer of the first refractive index pattern 131.

With continued reference to FIG. 3, the anti-reflective function layer further includes a second refractive index layer 132, the second refractive index layer 132 is located on a side of the first refractive index pattern 131 away from the display function layer 12, and the refractive index of the second refractive index layer 132 is greater than the refractive index of the first refractive index pattern 131.

The anti-reflective function layer 13 in this embodiment is used for increasing the light transmittance, the arrangement of the second refractive index layer 132 on the basis that the first refractive index pattern 131 is formed through the lithographic technology further facilitates the guide for light emitting, so that the light is prevented from being reflected and sealed in the film layer when the light directly reaches a refractive layer with a relatively high refractive index, thus achieving the anti-reflective effect.

Figure 8:
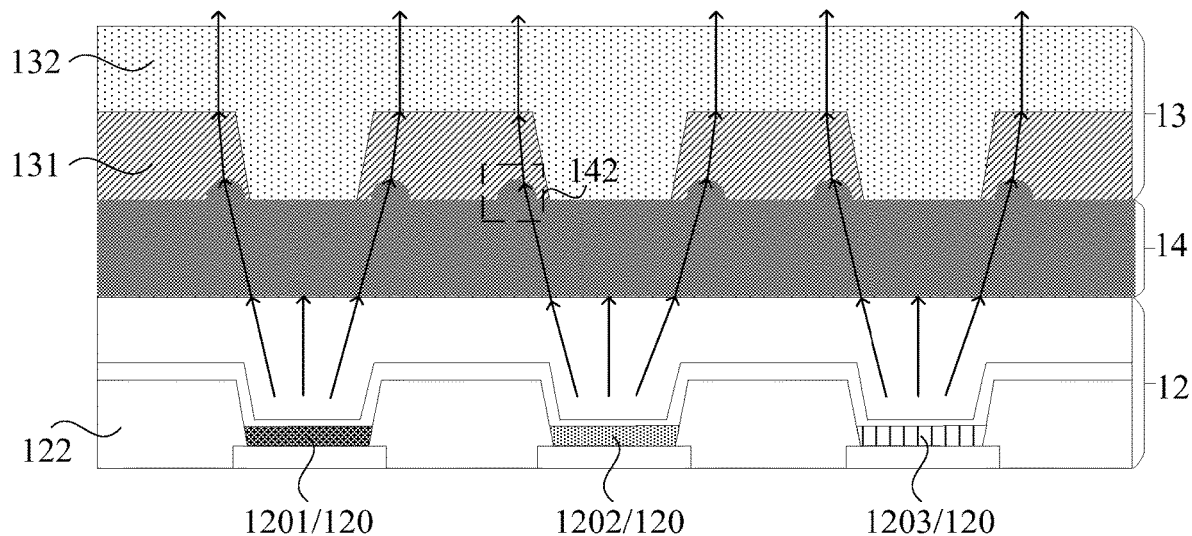
FIG. 8 is a structural schematic view of a light uniformizing structure in a display panel provided in an embodiment of the present disclosure.
Figure 9:
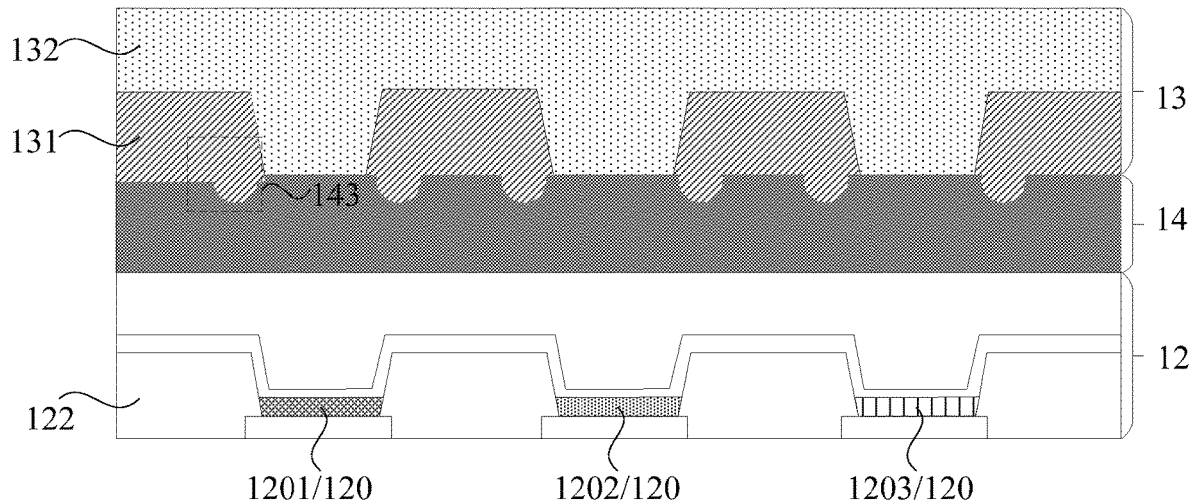
FIG. 9 is a structural schematic view of a light uniformizing structure in another display panel provided in an embodiment of the present disclosure.

FIG. 8 is a structural schematic view of a light uniformizing structure in a display panel provided in an embodiment of the present disclosure. FIG. 9 is a structural schematic view of a light uniformizing structure in another display panel provided in an embodiment of the present disclosure. Referring to FIG. 8, the light uniformizing structure is a convex structure 142, and referring to FIG. 9, the light uniformizing structure is a first concave structure 143.

Referring to FIG. 8, the convex structure 142 is formed on the inner side of the edge of the exposure region 151, and when exposure light is incident, a sudden light change occurs in the exposure region 151 and the non-exposure region 152, so that the convex structure 142 formed on the base material layer 14 is used to scatter the light as much as possible, disperse the photosensitive amount at the bottom, improve the degree of photocuring at the bottom of the first refractive index pattern 131, and avoid the phenomenon of holes, undercuts and the like at the bottom of the first refractive index pattern 131.

In this embodiment, the manner for forming the convex structure 142 may be referred to the manner for forming the light uniformizing structure of an upwardly protruding regular trapezoid in the above embodiments. When exposure light is incident, the light hits the convex structure 142 formed on the substrate layer 14, and the incident exposure light is subjected to multi-angle scattering along the surface of the convex structure 142 according to protruding features of the convex structure, so that the scattered light at the bottom is dispersed, the light sensitivity of the bottom is improved, and thus the degree of curing of the anti-reflective function layer is further improved.

In addition, when the light uniformizing structure is the convex structure 142, the arrow in FIG. 8 represents the light path diagram of light, and it can be found by observing FIG. 8 that part of the light originally subjected to total reflection may be emitted, so that the light efficiency is further improved.

Referring to FIG. 9, a first concave structure 143 is also formed at a boundary of the exposure region 151, and when exposure light is incident, the exposure light reaches the first concave structure 143 formed on the base material layer 14, so that the incident exposure light is scattered at multiple angles along the surface of the first concave structure 143, the scattered light at the bottom may also be dispersed, and the degree of curing of the anti-reflective function layer is further improved.

Due to the scattering effect of the exposure light, the light sensitivity of the incident light on the bottom layer of the anti-reflective function layer 13 is relatively high, therefore, when the light uniformizing structure is concave on the base material layer 14, the degree of curing of the anti-reflective function layer 13 on the base material layer 14 can still be ensured, and the occurrence of the phenomena of holes, undercuts and the like at the whole bottom of the anti-reflective function layer cannot be affected by a volume shrinkage.

In an embodiment, the base material layer may include a second concave structure, the second concave structure includes a part overlapping with the light-emitting element, and the second concave structure includes the first inclined sidewall.

Arrows in FIG. 3 represent a light path diagram of light, and it can be found by observing FIG. 3 that vertically-emitted light is directly emitted, light with a relatively large inclination angle is transmitted through the base material layer 14, the first refractive index pattern 131 and the second refractive index layer 132 in sequence, and the first refractive index pattern 131 and the second refractive index layer 132 are configured to improve the light transmittance, so as to improve the lighting effect.

Figure 10:
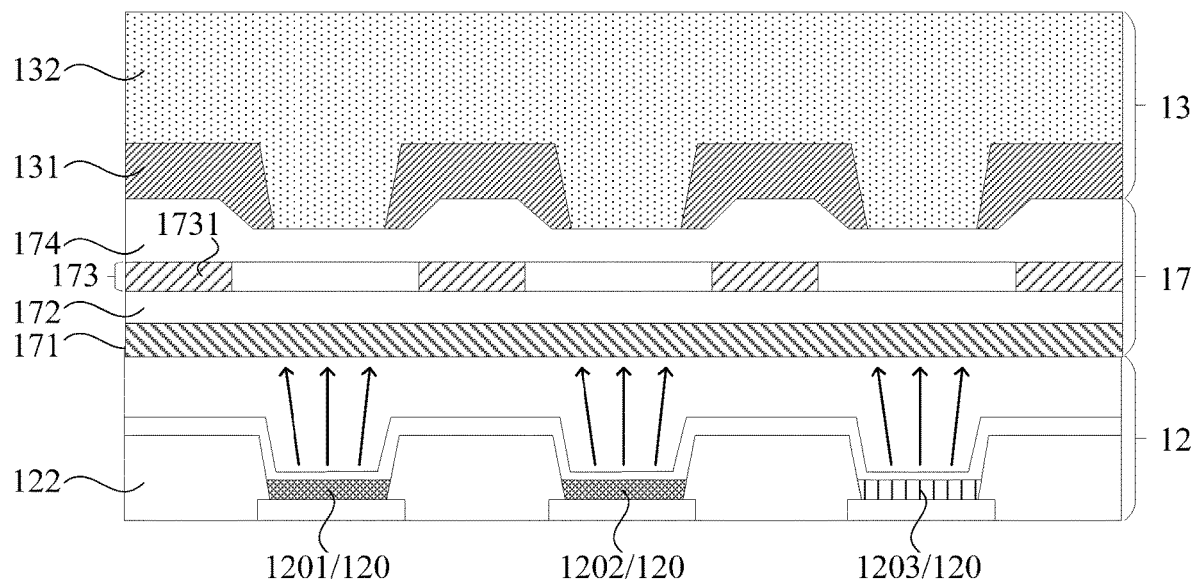
FIG. 10 is a structural schematic view of a base material layer in a display panel provided in an embodiment of the present disclosure.

FIG. 10 is a structural schematic view of a base material layer in a display panel provided in an embodiment of the present disclosure. Referring to FIG. 10, the base material layer may include a touch function layer 17, the touch function layer 17 is disposed between the display function layer 12 and the anti-reflective function layer 13, the touch function layer 17 includes a first electrode layer 171, a first insulating layer 172, a second electrode layer 173, and a second insulating layer 174 sequentially stacked in the light emitting direction, and the second insulating layer 174 is also used as the base material layer.

The first insulating layer 172 insulates the first electrode layer 171 and the second electrode layer 173 to avoid an electric leakage phenomenon. When the second insulating layer 174 is directly also used as the base material layer, a preparation process of the original base material layer is reduced, and thus the overall thickness of the display panel is reduced.

Figure 11:
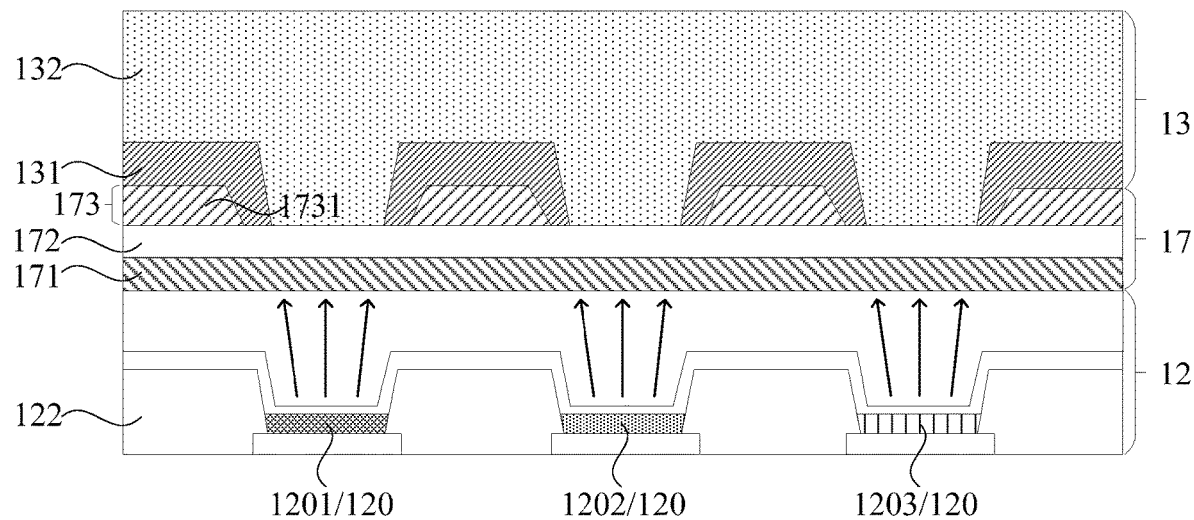
FIG. 11 is a structural schematic view of a base material layer in another display panel provided in an embodiment of the present disclosure.

In addition, since the base material layer is located between the display function layer 12 and the anti-reflective function layer 13, using the metal electrode layer as the light uniformizing structure, the light reflection can be greatly improved. FIG. 11 is a structural schematic view of a base material layer in another display panel provided in an embodiment of the present disclosure. Referring to FIG. 11, the touch function layer 17 is also disposed between the display function layer 12 and the anti-reflective function layer 13 and includes a first electrode layer 171, a first insulating layer 172, and a second electrode layer 173 that are sequentially stacked in the light emitting direction, the second electrode layer 173 includes a second electrode 1731, and the second electrode layer 173 is also used as the base material layer 14 in the above embodiments, and the second electrode 1731 is also used as the light uniformizing structure 141 in the above embodiments.

Similarly, an additional base material layer is not required in this embodiment, and the second electrode layer 173 is also used as the base material layer on the basis of the original touch function layer 17, so that the process of manufacturing the base material layer is also reduced, and the manufacturing cost is further reduced.

Figure 12:
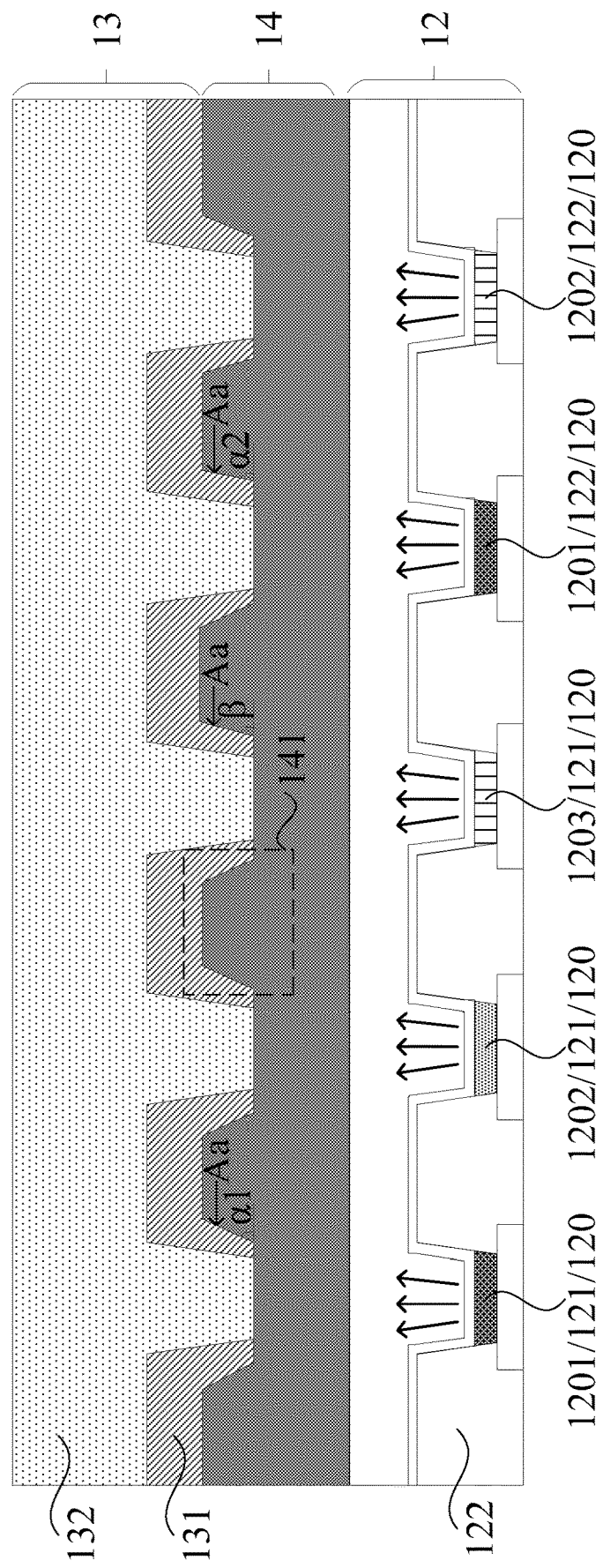
FIG. 12 is a structural schematic view of a light-emitting element in a display panel provided in an embodiment of the present disclosure.

FIG. 12 is a structural schematic view of a light-emitting element in a display panel provided in an embodiment of the present disclosure. As shown in FIG. 12, the light-emitting elements 120 include first light-emitting elements 121 and second light-emitting elements 122, the first light-emitting elements 121 and the second light-emitting elements 122 have the same light emitting color, the first light-emitting elements 121 and the second light-emitting elements 122 are alternately arranged, an included angle between the light emitting surface and the first inclined sidewall Aa adjacent to a first light-emitting element 121 is a first included angle $\alpha 1$, and an included angle between the light emitting surface and the first inclined sidewall Aa adjacent to a second light-emitting element 122 is a second included angle $\alpha 2$, and $\alpha 2 > \alpha 1$.

Exemplarily, in this embodiment, the first light-emitting elements 121 and the second light-emitting elements 122 as red light-emitting elements emitting the red light are taken as an example, and the first light-emitting elements 121 and the second light-emitting elements 122 are labeled here as the first red light-emitting elements 121 and the second red light-emitting elements 122.

Referring to FIG. 12, the light-emitting elements 120 may further include first color light-emitting elements 1201 and second color light-emitting elements 1202, the light emitting color of the first color light-emitting elements 1201 is different from the light emitting color of the second color light-emitting elements 1202, and the first color light-emitting element 1201 includes the first light-emitting elements 121 and the second light-emitting elements 122, an included angle between the light emitting surface and the first inclined sidewall Aa adjacent to a second color light-emitting element 1202 is an included angle $\beta$, and $\alpha 1 < \beta \le \alpha 2$.

Exemplarily, in this embodiment, the first color light-emitting elements 1201 are red light-emitting elements emitting the red light, and the second color light-emitting elements 1202 are green light-emitting elements emitting the green light.

In this embodiment, the first included angle $\alpha 1$ of 70° and the second included angle $\alpha 2$ of 75° are taken as an example. In the manufacturing process of the display panel, the light-emitting elements 120 may have a process error, so that an included angle between the light emitting surface and the first inclined sidewall Aa of the first red light-emitting element 121 deviates from the included angle between the light emitting surface and the first inclined sidewall Aa of the second red light-emitting element 122, and the deviation may directly influence the light emitting of the light-emitting elements, even a color cast phenomenon may be generated. In this embodiment, the light-emitting elements with the same light emitting color are arranged to be alternated and have different included angles with the light emitting surface, the influence of color cast caused by the process error of different light-emitting elements can be balanced, and the fluctuation of the color cast is further improved.

Figure 13:
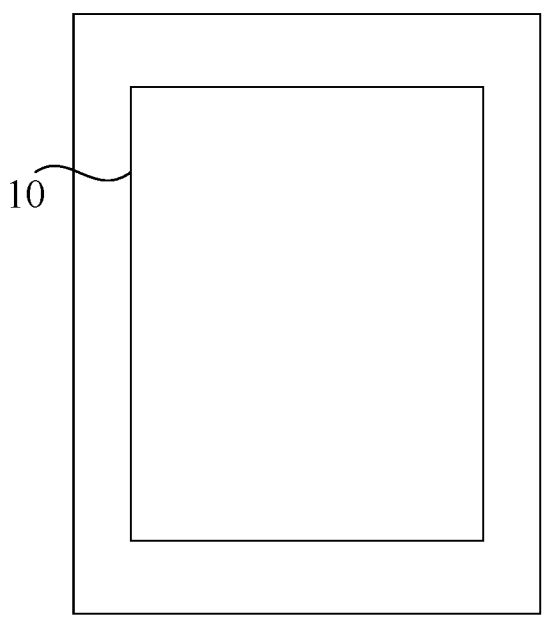
FIG. 13 is a structural schematic view of a display device provided in an embodiment of the present disclosure.

FIG. 13 is a structural schematic view of a display device provided in an embodiment of the present disclosure. Referring to FIG. 13, the display device 100 includes the display panel 10 provided in any one of the above embodiments.

Since the display device 100 provided in this embodiment includes the display panel 10 provided in any of the above-described embodiments, it has the same or corresponding beneficial effects as the display panel 10, which is not repeated here.

After the display function layer is formed and before the anti-reflective function layer is formed, the touch function layer is formed on the light emitting side of the display function layer, the touch function layer includes a first electrode layer, a first insulating layer, a second electrode layer and a second insulating layer which are sequentially stacked in the light emitting direction, and the second insulating layer is also used as the base material layer Another situation that the touch function layer is formed on the light emitting side of the display function layer is that: the touch function layer includes a first electrode layer, a first insulating layer and a second electrode layer which are sequentially stacked in the light emitting direction, the second electrode layer includes a second electrode, the second electrode layer is also used as the base material layer, and the second electrode is also used as the light uniformizing structure.

The preparation method of the touch function layer is a technique well known to those skilled in the art, which is not repeated here.

It should be noted that the above are merely alternative embodiments of the present disclosure and the technical principles applied herein. It should be understood by those skilled in the art that the present disclosure is not limited to the particular embodiments described herein. For those skilled in the art, various apparent modifications, adaptations, combinations and substitutions may be made without departing from the scope of the present disclosure. Therefore, although the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A display panel, comprising:
    a display function layer comprising a plurality of light-emitting elements and a pixel definition structure surrounding the plurality of light-emitting elements;
    an anti-reflective function layer disposed on a light emitting side of the display function layer and comprising a first refractive index pattern; wherein the first refractive index pattern overlaps with the pixel definition structure;
    a base material layer disposed between the anti-reflective function layer and the display function layer and comprising a light uniformizing structure; wherein the light uniformizing structure comprises a first inclined sidewall, and in a light emitting direction of the plurality of light-emitting elements, the first inclined sidewall is inclined towards a direction away from a light-emitting element adjacent to the first inclined sidewall.

2. The display panel of claim 1, wherein the first refractive index pattern covers the first inclined sidewall.

3. The display panel of claim 1, wherein the first refractive index pattern is made of a negative tone photoresist material.

4. The display panel of claim 1, wherein the first refractive index pattern comprises a second inclined sidewall, and in the light emitting direction of the plurality of light-emitting elements, the second inclined sidewall is inclined towards a direction away from a light-emitting element adjacent to the second inclined sidewall.

5. The display panel of claim 4, wherein an included angle between the second inclined sidewall and a light emitting surface of the plurality of light-emitting elements is greater than an included angle between the first inclined sidewall and the light emitting surface.

6. The display panel of claim 4, wherein in a direction parallel to a light emitting surface, in the first inclined sidewall and the second inclined sidewall that are adjacent to a same light-emitting element among the plurality of light-emitting elements, a distance between the first inclined sidewall and the light-emitting element is a first distance L1, a distance between the second inclined sidewall and the light-emitting element is a second distance L2, and a difference between the first distance L1 and the second distance L2 is 2 μm to 3 μm.

7. The display panel of claim 1, wherein the anti-reflective function layer further comprises a second refractive index layer, the second refractive index layer is disposed on a side of the first refractive index pattern away from the display function layer, and a refractive index of the second refractive index layer is larger than a refractive index of the first refractive index pattern.

8. The display panel of claim 1, wherein the light uniformizing structure is a convex structure.

9. The display panel of claim 1, wherein the base material layer comprises a second concave structure, the second concave structure comprises a part overlapping with the plurality of light-emitting elements, and the second concave structure comprises the first inclined sidewall.

10. The display panel of claim 1, wherein the light uniformizing structure is arranged to surround the plurality of light-emitting elements.

11. The display panel of claim 1, further comprising a touch function layer, wherein the touch function layer is disposed between the display function layer and the anti-reflective function layer, the touch function layer comprises a first electrode layer, a first insulating layer, a second electrode layer and a second insulating layer which are sequentially stacked in the light emitting direction, and the second insulating layer is also used as the base material layer.

12. The display panel of claim 11, wherein a surface of a side of the second insulating layer away from the display function layer comprises the first inclined sidewall.

13. The display panel of claim 1, further comprising a touch function layer, wherein the touch function layer is disposed between the display function layer and the anti-reflective function layer, the touch function layer comprises a first electrode layer, a first insulating layer and a second electrode layer which are sequentially stacked in the light emitting direction, the second electrode layer comprises a second electrode, the second electrode layer is also used as the base material layer, and the second electrode is also used as the light uniformizing structure.

14. The display panel of claim 1, wherein the plurality of light-emitting elements comprise first color light-emitting elements, the first color light-emitting elements comprise first light-emitting elements and second light-emitting elements, and the first light-emitting elements and the second light-emitting elements are alternately arranged; and an included angle between a light emitting surface of the plurality of light-emitting elements and the first inclined sidewall adjacent to one of the first light-emitting elements is a first included angle $\alpha 1$, an included angle between the light emitting surface and the first inclined sidewall adjacent to one of the second light-emitting elements is a second included angle $\alpha 2$, and $\alpha 2 > \alpha 1$.

15. The display panel of claim 14, wherein the plurality of light-emitting elements further comprise second color light-emitting elements, and a light emitting color of the first color light-emitting elements is different from a light emitting color of the second color light-emitting elements; and an included angle between the light emitting surface and the first inclined sidewall adjacent to one of the second color light-emitting elements is an included angle $\beta$, and $\alpha 1 < \beta \geq \alpha 2$.

16. The display panel of claim 1, wherein an included angle $\gamma$ between the first inclined sidewall and a light emitting surface of the plurality of light-emitting elements is greater than or equal to 45°.

17. The display panel of claim 1, wherein in the light emitting direction, a height H of the light uniformizing structure is greater than or equal to 0.5 µm.

18. A display device, comprising a display panel;

wherein the display panel comprises:

a display function layer comprising a plurality of light-emitting elements and a pixel definition structure surrounding the plurality of light-emitting elements;

an anti-reflective function layer disposed on a light emitting side of the display function layer and comprising a first refractive index pattern; wherein the first refractive index pattern overlaps with the pixel definition structure;

a base material layer disposed between the anti-reflective function layer and the display function layer and comprising a light uniformizing structure; wherein the light uniformizing structure comprises a first inclined sidewall, and in a light emitting direction of the plurality of light-emitting elements, the first inclined sidewall is inclined towards a direction away from a light-emitting element adjacent to the first inclined sidewall.

\* \* \* \* \*